United States Patent
Takeda (10) Patent No.: US 8,427,728 B2
(45) Date of Patent: Apr. 23, 2013

(54) OPTICAL SCANNER

(75) Inventor: Hitoshi Takeda, Nagoya (JP)

(73) Assignee: Brother Kogyo Kabushiki Kaisha, Nagoya-Shi, Aichi-Ken (JP)

( * ) Notice: Subject to any disclaimer, the term of this patent is extended or adjusted under 35 U.S.C. 154(b) by 364 days.

(21) Appl. No.: 12/851,093

(22) Filed: Aug. 5, 2010

(65) Prior Publication Data

US 2010/0296145 A1 Nov. 25, 2010

Related U.S. Application Data

(63) Continuation-in-part of application No. PCT/JP2008/072240, filed on Dec. 8, 2008.

(30) Foreign Application Priority Data

Feb. 5, 2008 (JP) ................................. 2008-025022

(51) Int. Cl.
*G02B 26/08* (2006.01)

(52) U.S. Cl.
USPC ........................................ 359/224.1; 359/904

(58) Field of Classification Search .... 359/198.1–199.4, 359/200.6–200.8, 202.1, 221.2, 223.1–225.1, 359/226.2, 904, 290–295, 838, 846, 871, 359/872; 250/204, 559.06, 559.29, 230, 250/234; 347/255–260; 353/39, 98–99; 385/15–18, 22; 398/12, 19, 45
See application file for complete search history.

(56) References Cited

U.S. PATENT DOCUMENTS

| 7,394,583 B2 | 7/2008 | Akedo et al. |
| 2006/0245023 A1 | 11/2006 | Akedo et al. |
| 2007/0146858 A1 * | 6/2007 | Matsuda ....................... 359/224 |

FOREIGN PATENT DOCUMENTS

| JP | 62-220920 | 9/1987 |
| JP | 10-104543 | 4/1998 |
| JP | 2006-293116 | 10/2006 |

OTHER PUBLICATIONS

International Preliminary Report on Patentability together with the Written Opinion dated Sep. 16, 2010.
International Search Report dated Mar. 10, 2009.
Japanese Official Action dated Sep. 4, 2012 together with English translation from related application JP 2008-025022.

* cited by examiner

*Primary Examiner* — Jennifer L. Doak
(74) *Attorney, Agent, or Firm* — Scully, Scott, Murphy & Presser, P.C.

(57) ABSTRACT

A pair of substrate portions each being tabular-shaped has side portions located closer to a mirror portion and connected, at both ends thereof in the oscillation axis direction, by a pair of supporting beam portions, and also has outer side portions fixed to a fixing member. An excitation device is formed on at least one substrate portion. The pair of substrate portions is disposed symmetrically in the direction perpendicular to the oscillation axis. A pair of torsion beam portions extends outward from two opposite sides of the mirror portion on the oscillation axis, and each is connected to the center of each supporting beam portion in a longitudinal direction. An edge of the piezoelectric element on an outer side thereof in the direction perpendicular to the oscillation axis is spaced from an outer side portion of the at least one substrate portion in a direction closer to the mirror portion.

11 Claims, 6 Drawing Sheets

| Type | PIEZOELECTRIC ELEMENT ARRANGEMENT EXAMPLE | MIRROR END DISPLACEMENT HEIGHT H |
|---|---|---|
| 1 | | 100 |
| 2 | | 49.4 |
| 3 | | 16.5 |
| 4 | | 19.9 |
| 5 | | 27.4 |

OPTICAL SCANNER

CROSS-REFERENCE TO RELATED APPLICATION

The present application is a continuation-in-part application of PCT International Patent Application No. PCT/JP2008/072240 filed on Dec. 8, 2008 which designated the United States, and claims priority to Japanese Patent Application No. JP2008-025022 filed on Feb. 5, 2008. The contents of each of the prior filed applications are incorporated herein by reference in its entirety.

TECHNICAL FIELD

The disclosure relates to an optical scanner.

BACKGROUND

There has been conventionally known an optical scanner comprising a base plate which is formed in such a manner as to be partly removed while leaving a mirror portion and a pair of torsion beam portions each of which has one end connected to one of opposite ends of the mirror portion, the base plate which is supported by a support member in only one end thereof in a cantilevered manner and wherein a piezoelectric element is provided on part of the base plate.

SUMMARY

The disclosure has an object to provide an optical scanner in which an oscillation axis of a mirror portion is not displaced in any direction when the mirror portion is oscillated.

To achieve the purpose of the disclosure, there is provided an optical scanner comprising a mirror portion to be oscillated around an oscillation axis so as to scan light in a predetermined direction, the optical scanner comprising, a pair of torsion beam portions arranged along the oscillation axis of the mirror portion, each of the pair of torsion beam portions having one end connected to one of two opposing ends of the mirror portion with respect to a direction of the oscillation axis, a pair of supporting beam portions, each center of which in a longitudinal direction is connected to other end of each of the pair of torsion beam portions, opposing each other, a pair of substrate portions arranged on opposite sides across the mirror portion, symmetrically with respect to a direction at right angles to the oscillation axis, each of the pair of substrate portions being tabular-shaped and connected, at an inner side portion thereof, to end portions of the pair of supporting beam portions with respect to a longitudinal direction, a fixing member to be connected to an outer side portion of each of the pair of substrate portions, and an excitation device formed on a surface of at least one of the pair of substrate portions, wherein an edge on an outer side of the excitation device with respect to the direction at right angles to the oscillation axis is spaced from an outer side portion of the at least one of the pair of substrate portions in a direction closer to the mirror portion.

DETAILED DESCRIPTION

Hereinafter, the optical scanner according to the disclosure will be described in detail with reference to the drawings, based on an embodiment embodying the disclosure.

First, a schematic configuration of an optical scanner 1 according to the preferred embodiment will be described with reference to FIGS. 1 to 3.

Figure 1:
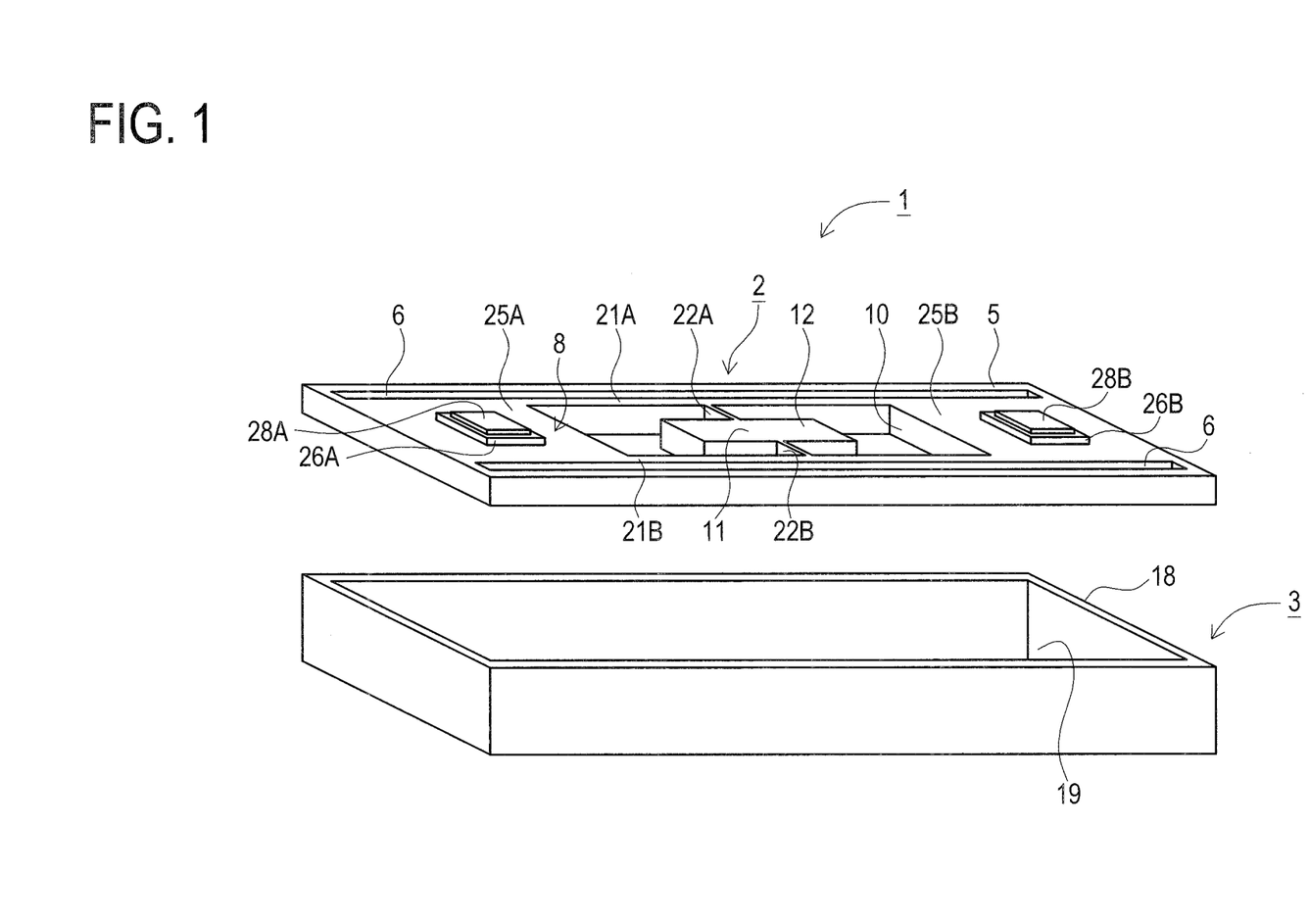
FIG. 1 is an exploded perspective view illustrating a schematic configuration of an optical scanner according to the present embodiment.
Figure 2:
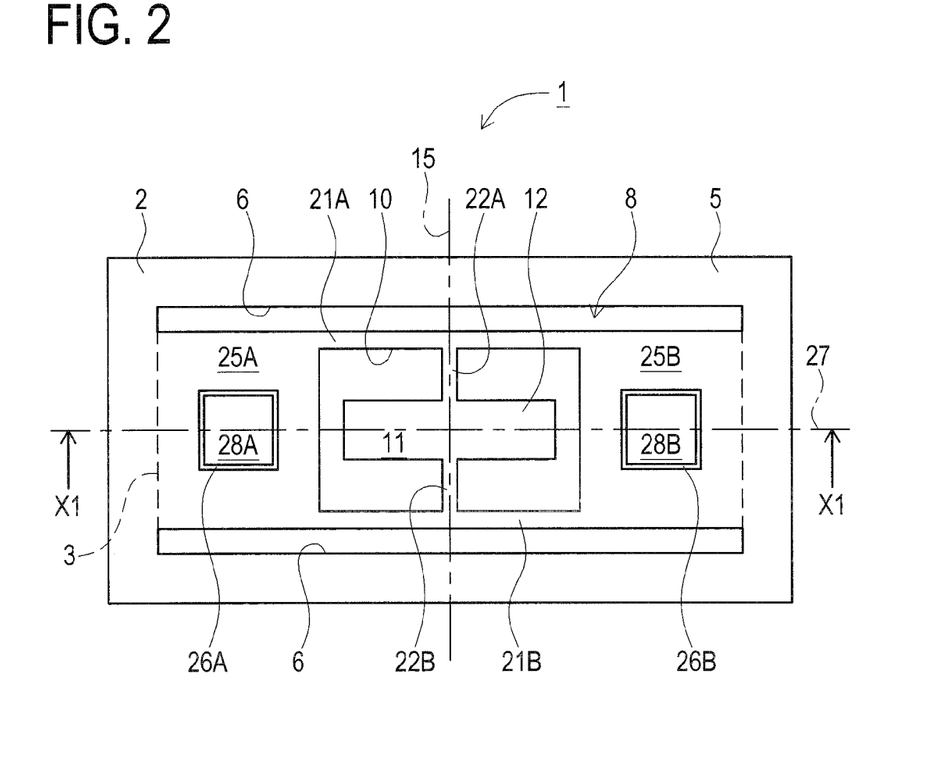
FIG. 2 is a plan view of the optical scanner.
Figure 3:
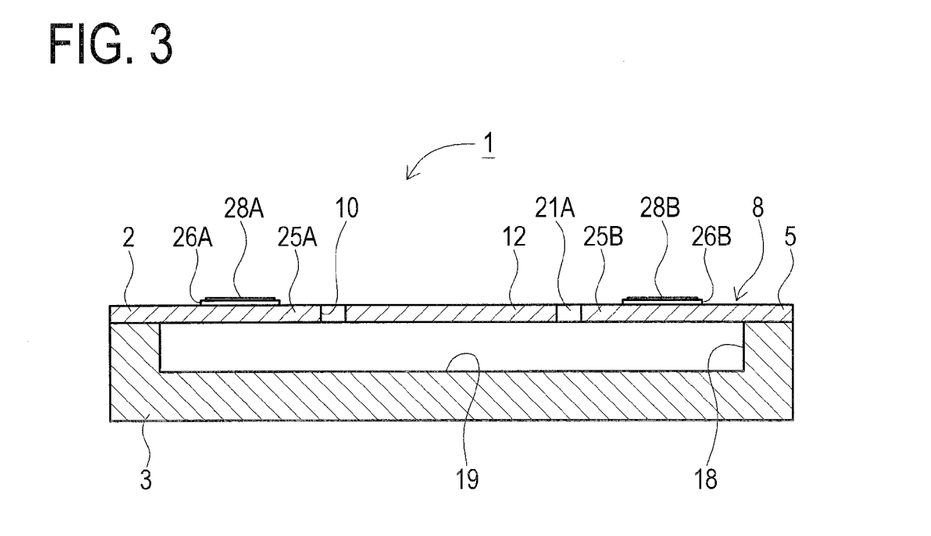
FIG. 3 is an X1-X1 cross sectional view of FIG. 2.

As illustrated in FIGS. 1 to 3, the optical scanner 1 is configured through mounting a main body portion 2 to a base 3. The main body portion 2 is formed using an electroconductive material having elasticity, such as stainless steel (for example, SUS304 or SUS430 of Japanese Industrial Standards, etc.), titanium, or iron, through press work or etching. The thickness of the main body portion 2 is set to be approximately 30 μm to 100 μm.

The main body portion 2 is schematically rectangular, thin-board shaped as illustrated in the upper part of FIG. 1, and FIGS. 2 and 3. A fixing frame 5 is provided outside the main body portion 2. Inside the fixing frame 5, a pair of slit-like through holes 6 is formed facing each other, along both side portions of the fixing frame 5 in a longitudinal direction. A vibrator 8, rectangular-shaped in plan view, is also provided therein.

At the center portion in a longitudinal direction of the vibrator 8 is formed a through hole 10 shaped rectangular in plan view, through which light beams can pass. At the center of the through hole 10 is installed a reflection mirror portion 12 shaped approximately rectangular in plan view. The reflection mirror portion 12 includes a reflective surface 11 and is disposed so as to be symmetric with respect to an oscillation axis 15, in a perpendicular direction, in other words, in a longitudinal direction with respect to the reflection mirror portion 12. The shapes of the reflection mirror portion 12 are not limited to rectangular shapes, but may include squares, approximate quadrangles, diamonds, polygons, circles, ovals, etc.

Responsive to the above configuration of the main body portion 2, the base 3 is configured to include a supporting portion 18 and a concave portion 19, as illustrated in the lower part of FIG. 1 and FIGS. 2 and 3. The fixing frame 5 is to be mounted onto the supporting portion 18 and the concave portion 19 is facing the vibrator 8 when the main body portion 2 is mounted to the base 3. The concave portion 19 is formed in order to achieve a shape where the vibrator 8 does not interfere with the base 3 even if displaced by vibrations when the main body portion 2 is mounted to the base 3.

The reflective surface 11 of the reflection mirror portion 12 is oscillated around the oscillation axis 15, which is also a center line of symmetry thereof in a longitudinal direction. The vibrator 8 is further provided with a pair of torsion beam portions 22A and 22B, each of which extends from each of the opposite side faces of the reflection mirror portion 12 on the oscillation axis 15 outward on the same plane, and connects the reflection mirror portion 12 with each of a pair of supporting beam portions 21A and 21B respectively forming the opposing sides of the through hole 10. In other words, from each of the opposite side faces of the reflection mirror portion 12, each of the pair of torsion beam portions 22A and 22B is extended along the oscillation axis 15, in a direction opposite to each other, and is connected to each of the pair of opposing supporting beam portions 21A and 21B.

Here, the reflection mirror portion 12 is formed approximately 800 μm to 1200 μm in a long side in plan view and approximately 100 μm to 500 μm in a short side (width direction) in plan view. The pair of torsion beam portions 22A and 22B is each formed approximately 80 μm to 150 μm in a short side (width direction) orthogonal to the oscillation axis 15 in plan view, and approximately 250 μm to 1500 μm in a long side along the oscillation axis 15.

Each of the pair of opposing supporting beam portions 21A and 21B are formed symmetrically with respect to the oscillation axis 15 in longitudinal direction. Both ends of each of the supporting beam portions 21A and 21B in a longitudinal direction are connected respectively to both ends of the side portions closer to the reflection mirror portion 12 of a pair of substrate portions 25A and 25B. The pair of substrate portions 25A and 25B is each formed in a tabular shape, arranged on opposite sides with respect to the reflection mirror portion 12, symmetrically in a perpendicular direction with respect to the oscillation axis 15. The outer side portions of the pair of substrate portions 25A and 25B are fixed to the base 3 through the fixing frame 5. Accordingly, the reflection mirror portion 12, the pair of supporting beam portions 21A and 21B and the pair of substrate portions 25A and 25B are respectively arranged to be symmetric in a direction perpendicular to the oscillation axis 15.

On the surfaces of the pair of substrate portions 25A and 25B is formed a pair of piezoelectric elements 26A and 26B respectively. Each of the pair of piezoelectric elements 26A and 26B is layered approximately 1 μm to 10 μm thick and substantially square-shaped, approximately 500 μm to 1500 μm per side in plan view. The shapes of the pair of piezoelectric elements 26A and 26B are not limited to squares in plan view, but may include rectangular shapes, approximate quadrangles, diamonds, polygons, circles, ovals, etc. in plan view.

The pair of piezoelectric elements 26A and 26B is formed to have each center thereof on an axis line 27. The axis line 27 is a line passing through a center position, with respect to the direction of the oscillation axis 15, on the oscillation axis 15 of the reflection mirror portion 12, and intersecting at right angles with the oscillation axis 15. Further, the pair of piezoelectric elements 26A and 26B is formed symmetrically with respect to the oscillation axis 15, on opposite sides with respect to the reflection mirror portion 12.

Each of the pair of piezoelectric elements 26A and 26B has an edge disposed on the outer side in a direction perpendicular to the oscillation axis 15. The edge is formed in a position in a predetermined distance from the outer side portion of each of the substrate portions 25A and 25B toward the reflection mirror portion 12, namely, the connection portion of the substrate portions 25A and 25B to the fixing frame 5. Accordingly, the outer side portion of each of the pair of piezoelectric elements 26A and 26B disposed on the outer side in the direction perpendicular to the oscillation axis 15 is formed in a position spaced from an inner side of the supporting portion 18 of the base 3. As a result, standing waves having a node at the oscillation axis 15 can be produced at the pair of the substrate portions 25A and 25B and the pair of the supporting beam portions 21A and 21B as described below (see FIG. 5).

The following is a manufacturing method of the pair of piezoelectric elements 26A and 26B. First, the surfaces of the fixing frame 5 and the vibrator 8 are masked, leaving areas for the pair of piezoelectric elements 26A and 26B unmasked, by use of a resist film or a piece of metal prepared separately in which areas for forming the pair of piezoelectric elements 26A and 26B are cut out. After that, by an aerosol deposition method (AD method) for forming a film through splaying fine particles of a nano-sized piezoelectric material such as piezoelectric zirconate titanate (PZT), the piezoelectric material such as PZT is layered approximately 1 μm to 10 μm to form each of the piezoelectric elements 26A and 26B, and then the resist film or the piece of metal is removed.

A pair of upper electrodes 28A and 28B is formed above the pair of piezoelectric elements 26A and 26B, respectively, being layered approximately 0.2 μm to 0.6 μm thick in a manner that each of the pair of upper electrodes 28A and 28B has a predetermined gap from the periphery of each of the piezoelectric elements 26A and 26B.

The following is a manufacturing method of the pair of upper electrodes 28A and 28B. First, a resist film is formed for masking the surface of the fixing frame 5 and the vibrator 8, leaving areas for the formation of the pair of upper electrodes 28A and 28B unmasked, so as to form the pair of upper electrodes 28A and 28B on the piezoelectric elements 26A and 26B respectively. Then, by physical vapor deposition (PVD) or vacuum deposition, platinum (Pt) or gold (Au), etc. is layered approximately 0.2 μm to 0.6 μm to form the pair of upper electrodes 28A and 28B, then the resist film is removed. For example, 0.05 μm of titanium (Ti) may be layered on the areas for the pair of upper electrodes 28A and 28B, and platinum may be layered 0.5 μm thereover, and after that, the resist film may be removed.

Accordingly, as described below, through wire-bonding each of the portions of the fixing frame 5 which are respectively facing the outer side portions of the substrate portions 25A and 25B and also wire-bonding each of the upper electrodes 28A and 28B, it becomes possible to apply drive voltage to each of the piezoelectric elements 26A and 26B formed on each of the substrate portions 25A and 25B (see FIG. 4). That is, it becomes possible to apply drive voltage without imposing a load to the reflection mirror portion 12, the torsion beam portions 22A and 22B and the supporting beam portions 21A and 21B.

In the above-described manufacturing methods relating to the main body portion 2, each of the piezoelectric elements 26A and 26B is formed as a piezoelectric element layer by the AD method, and each of the upper electrodes 28A and 28B is formed as an upper electrode layer by the physical vapor deposition or the vacuum deposition. However, the piezoelectric elements 26A and 26B may be formed by the physical vapor deposition or by the vacuum deposition. Also, the upper electrodes 28A and 28B may be formed by the AD method. The physical vapor deposition includes, for example, a sputtering method, in which a direct-current voltage or an alternate-current voltage is applied between a substrate portion and a target material while introducing inert gas into a vacuum, the ionized inert gas is made to collide with the target material, and the sputtered target material is formed into a film on the substrate portion. However, the manufacturing methods are not limited to the above, and chemical vapor deposition (CVD) may be used to form at least one of the piezoelectric element layer and the upper electrode layer.

Figure 4:
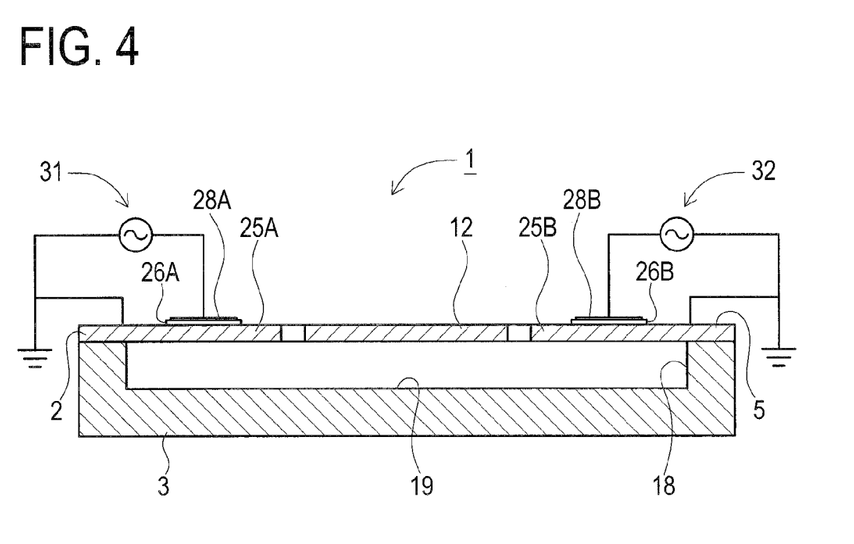
FIG. 4 is a view illustrating an example of oscillation drive of a reflection mirror portion.
Figure 5:
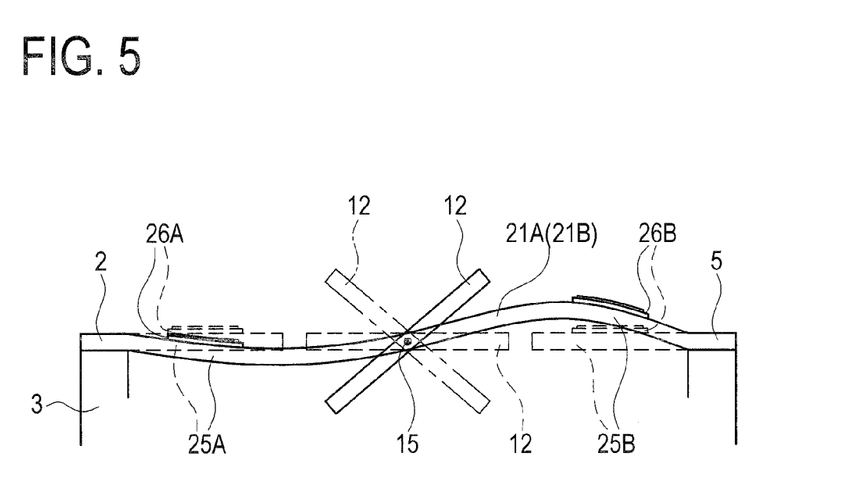
FIG. 5 is a view illustrating a first resonant state in which the reflection mirror portion and each supporting beam portion are oscillating in a same phase.
Figure 6:
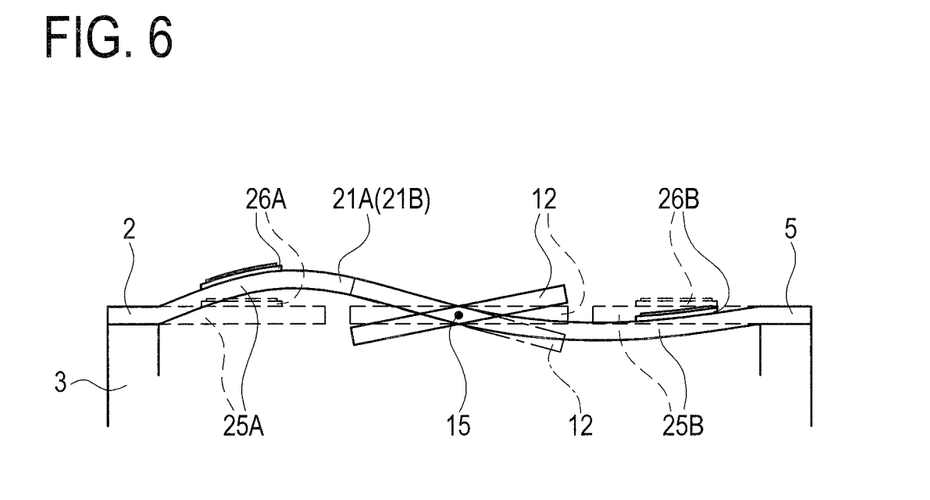
FIG. 6 is a view illustrating a second resonant state in which the reflection mirror portion and each supporting beam portion are oscillating in opposite phases.

Next, the oscillation drive of the optical scanner 1 is described based on FIG. 4 to FIG. 6.

As illustrated in FIG. 4, a predetermined drive voltage (obtained by, for example, adding a bias voltage of an amplitude of approximately 30 volts to an alternating voltage of approximately 30 volts) is applied through a drive circuit 31 to the fixing frame 5 of the main body portion 2 and the upper electrode 28A formed on the substrate portion 25A. As a result, in the piezoelectric element 26A formed on the substrate portion 25A, there is produced displacement in a direction perpendicular to the application direction of the drive voltage, namely, in the direction of the axis line 27 orthogonal to the oscillation axis 15.

A drive voltage of the equal amplitude and in the opposite phase to the output voltage from the drive circuit 31 is also applied through a drive circuit 32 to the fixing frame 5 of the main body portion 2 and the upper electrode 28B formed on the substrate portion 25B. As a result, in the piezoelectric element 26B formed on the substrate portion 25B, there is produced displacement in the direction opposite to that of the displacement of the piezoelectric element 26A, in the direction perpendicular to the application direction of the drive voltage, namely, in the direction of the axis line 27 orthogonal to the oscillation axis 15.

Here, in each of the substrate portions 25A and 25B, the outer side portion connected to the fixing frame 5 is defined as a fixed side and the inner side portion connected to each of the supporting beam portions 21A and 21B is defined as a free side. As illustrated in FIG. 5, as each of the piezoelectric elements 26A and 26B is displaced, each free side is displaced in the same direction as the displacement of each of the piezoelectric elements 26A and 26B. The displacement of each free side may be upward or downward, according to the upward or downward displacement of each of the piezoelectric elements 26A and 26. That is, each free side is displaced in a direction opposite to each other. As a result, a standing wave having the node at the oscillation axis 15 can be produced in the substrate portions 25A and 25B and the supporting beam portions 21A and 21B.

The standing wave having the node at the oscillation axis 15 can act a force to give a rotational moment on the reflection mirror portion 12 which is supported by the torsion beam portions 22A and 22B in a horizontal manner, inducing a torsional vibration therein. As a result, the reflection mirror portion 12 is oscillated around the oscillation axis 15 which is the axis core of the torsion beam portions 22A and 22B. The oscillation axis 15 is positioned on the node of this standing wave, and therefore will not be displaced in any direction.

As illustrated in FIGS. 5 and 6, through applying drive voltages in mutually opposite phases respectively to the piezoelectric elements 26A and 26B formed on the substrate portions 25A and 25B and producing the standing wave therein, the following states can be set: the first resonant state in which the supporting beam portions 21A and 21B and the reflection mirror portion 12 oscillate in the same phase, and the second resonant state in which the supporting beam portions 21A and 21B and the reflection mirror portion 12 oscillate in opposite phases.

The displacement height of the reflection mirror portion 12 around the oscillation axis 15 at both ends thereof in the direction of the axis line 27 orthogonal to the oscillation axis 15 is larger in the first resonant state in which the supporting beam portions 21A and 21B and the reflection mirror portion 12 oscillate in the same phase than in the second resonant state in which the supporting beam portions 21A and 21B and the reflection mirror portion 12 oscillate in opposite phases.

Next will be discussed changes in the displacement height of the reflection mirror portion 12 at both outer ends in the direction of the axis line 27, in a case the center points of the piezoelectric elements 26A and 26B are moved on the axis line 27 respectively so as to keep the symmetry relation of the center points with respect to the oscillation axis 15, based on FIG. 7.

Figure 7:
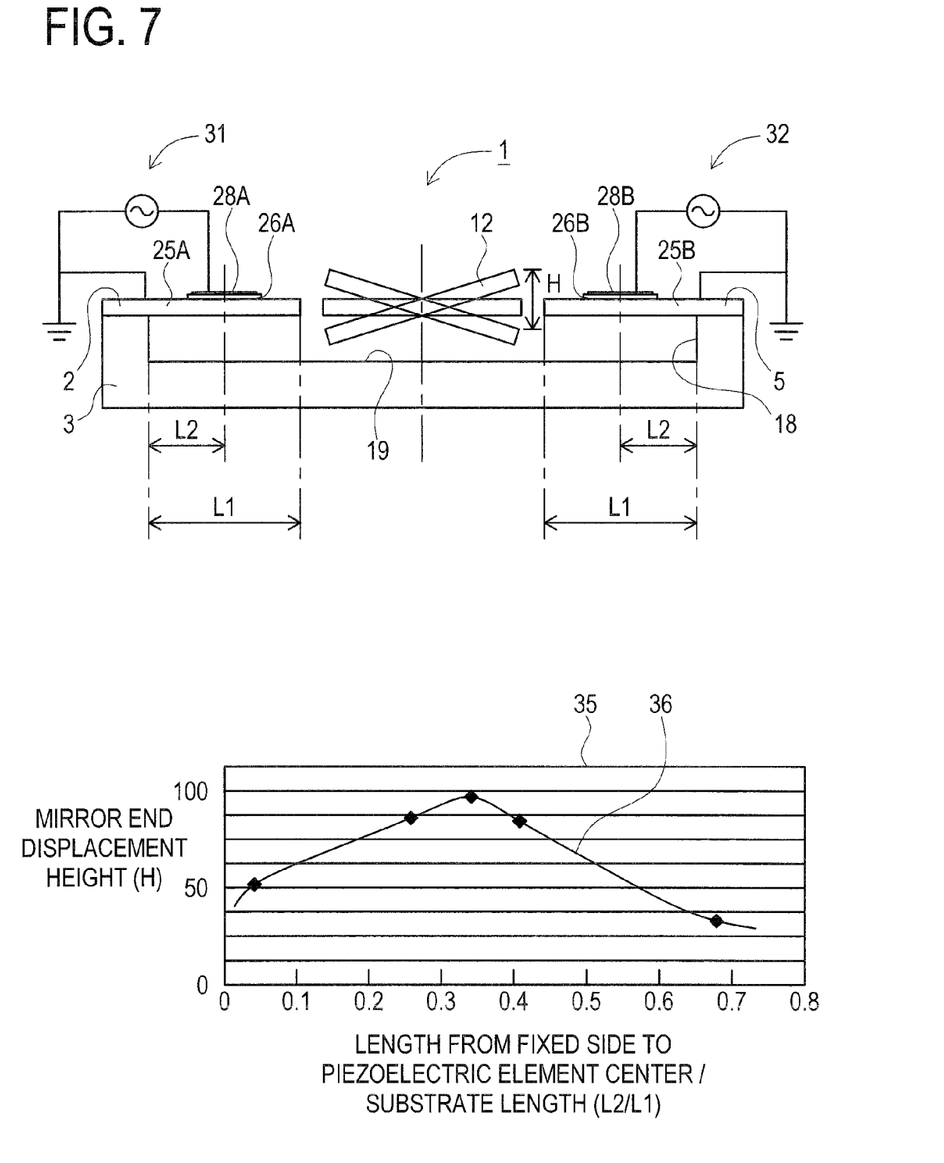
FIG. 7 is an explanatory view illustrating an example of changes in displacement height of both outer ends of the reflection mirror portion if a center point of each piezoelectric element is moved on an axis line.

The reference mark L1 as illustrated in the upper portion of FIG. 7 represents a length from the outer side portion connected to the fixing frame 5 to the inner side portion closer to the reflection mirror portion 12 in the substrate portion 25A or 25B, namely, a distance along the axis line 27 from the inner surface of the supporting portion 18 of the base 3 to the inner side portion closer to the reflection mirror portion 12 in the substrate portion 25A or 25B. Also, the reference mark L2 represents a length from the outer side portion connected to the fixing frame 5 in the substrate portion 25A to the center point of the piezoelectric element 26A or from the outer side portion of the substrate portion 25B to the center point of the piezoelectric element 26B, namely, a distance, along the axis line 27, from the inner surface of the supporting portion 18 of the base 3 to the center point of the piezoelectric element 26A or 26B.

The reference mark H as illustrated in the upper portion of FIG. 7 represents the displacement height of the reflection mirror portion 12 in a vertical direction at the outer ends thereof in the direction of the axis line 27 in a case drive voltages in mutually opposite phases are applied to the piezoelectric elements 26A and 26B respectively, through the drive circuits 31 and 32, so that the reflection mirror portion 12 is oscillated around the oscillation axis 15. The displacement height H of the reflection mirror portion 12 at the outer ends thereof was measured by using a laser Doppler displacement meter, synchronized with the drive voltages in opposite phases applied to the piezoelectric elements 26A and 26B.

A displacement height change chart 35 in the lower portion of FIG. 7 is an example of an observed result, and illustrates the displacement height H of the reflection mirror portion 12 in a vertical direction at the outer ends thereof in the direction of the axis line 27, when changing the distance L2 from the outer side portion connected to the fixing frame 5 in the substrate portion 25A or 25B to the center point of the piezoelectric element 26A or 26B. Note that the displacement height change chart 35 is an example of an actually observed result, which was carried out by applying to the piezoelectric elements 26A and 26B drive voltages in mutually opposite phases respectively so as to produce the first resonant state in which the reflection mirror portion 12 was oscillated in the same phase with the supporting beam portions 21A and 21B.

A change curve 36 in the displacement height change chart 35 illustrates the displacement height H of the outer ends of the reflection mirror portion 12 for division (L2/L1) obtained by dividing the distance L2 from the outer side portion connected to the fixing frame 5 in the substrate portion 25A or 25B to the center point of the piezoelectric element 26A or 26B by the length L1 of the substrate portion 25A or 25B. In this example of the observed result, the piezoelectric elements 26A and 26B were respectively energized with drive voltages in mutually opposite phases, which were obtained by adding a bias voltage of amplitude of approximately 30 volts to an alternating voltage of approximately 30 volts. Also, each of the piezoelectric elements 26A and 26B was formed in a square approximately 5 µm in thickness and 1 mm on a side in plan view, and then measured.

As the change curve 36 indicates, if the maximum displacement height H is set to be approximately 100, the displacement height H of the outer ends of the reflection mirror portion 12 gradually increases, starting from approximately 50, as the value of division (L2/L1) increases from approximately 0.04. When the value of division (L2/L1) becomes approximately 0.34, the displacement height H of the outer ends of the reflection mirror portion 12 reaches the maximum of approximately 100. Then, the displacement height H of the outer ends of the reflection mirror portion 12 decreases as the value of division (L2/L1) increases from 0.34, and when the value of division (L2/L1) becomes approximately 0.69, decreases to approximately 32.5, if the maximum displacement height H is set to be approximately 100.

Accordingly, as the change curve 36 of the displacement height change chart 35 illustrates, it is made possible to set the displacement height H of the outer ends of the reflection mirror portion 12 to be approximately the maximum displacement height H, through setting the distance L2 from the outer side portion connected to the fixing frame 5 in the substrate portion 25A or 25B to the center point of the piezoelectric element 26A or 26B to be within a predetermined distance range (for example, a range defined by the following equation: L2/L1=0.32 to 0.36).

Next, other arrangement examples of the piezoelectric elements 26A and 26B on the substrate portions 25A and 25B will be described based on FIG. 8.

Figure 8:
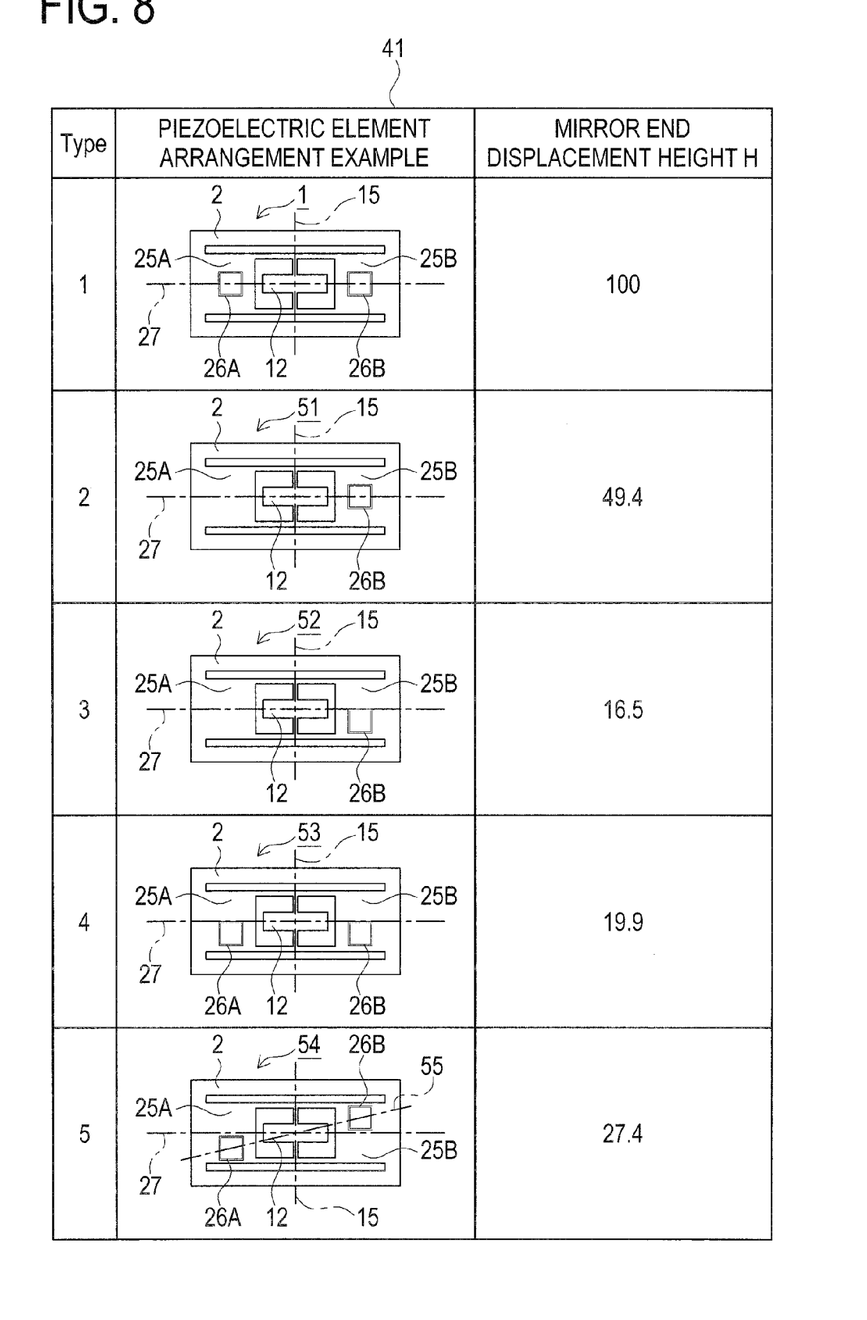
FIG. 8 is an arrangement example table illustrating other arrangement examples of each piezoelectric element on each substrate portion.

As illustrated in FIG. 8, the arrangement example table 41 is made up of the following items: "Type;" listing the types of the optical scanner in which the piezoelectric elements 26A and 26B is arranged differently, "Piezoelectric Element Arrangement Example;" listing arrangement manners of each of the piezoelectric elements 26A and 26B of each "Type," and "Mirror End Displacement Height H," indicating the maximum displacement height H of both outer ends of the reflection mirror portion 12 (see FIG. 7).

The item "Type 1" represents the above optical scanner 1. Each of the items "Type 2" to "Type 5" represents each of optical scanners 51 to 54, of which a main body portion 2 has the same configuration as the main body portion 2 of the above optical scanner 1, but the piezoelectric elements 26A and 26B are arranged differently. A reference mark in the optical scanners 51 to 54 which is the same as in the above optical scanner 1 refers to the same portion as in the above optical scanner 1. Drive voltages were applied to the piezoelectric elements 26A and 26B of the optical scanners 51 to 54, as well as the above optical scanner 1, to oscillate the reflection mirror portion 12 in the same phase with the supporting beam portions 21A and 21B, i.e., in the first resonant state. In each of the optical scanners 1 and 51 to 54, the displacement height H of the reflection mirror portion 12 on the outer ends was measured by using a laser Doppler displacement meter, synchronized with the drive voltages applied to the piezoelectric elements 26A and 26B.

Accordingly, in the optical scanner 1 of "Type 1" in the arrangement example table 41 is illustrated a state in which the center points of the piezoelectric elements 26A and 26B are disposed so as to be in positions in which the division (L2/L1) equals 0.34 on the axis line 27 (see FIG. 7). As described above, there was set approximately 100 as the maximum displacement height H of the outer ends of the reflection mirror portion 12 in the first resonant state when applying, to the piezoelectric elements 26A and 26B, drive voltages in opposite phases obtained by adding a bias voltage of approximately 30 volts to an alternating voltage of amplitude of approximately 30 volts (see FIG. 7).

Also, the optical scanner 51 of "Type 2" in the arrangement example table 41 is configured so that only the piezoelectric element 26B is formed on the substrate portion 25B and the center point of the piezoelectric element 26B is disposed in a position where the division (L2/L1) equals 0.34 on the axis line 27. The value approximately 49.4 was obtained as the maximum displacement height H of the outer ends of the reflection mirror portion 12 in the first resonant state, when applying, to the piezoelectric element 26B, a drive voltage obtained by adding a bias voltage of approximately 30 volts to an alternating voltage of amplitude of approximately 30 volts, if the maximum displacement height HH of the "Type 1" was set to be approximately 100.

Accordingly, the optical scanner 51 was able to oscillate the reflection mirror portion 12 around the oscillation axis 15 through applying the drive voltage as described above to the piezoelectric element 26B. As the reflection mirror portion 12 was able to be oscillated in the first resonant state, the oscillation axis 15 of the reflection mirror portion 12 was not displaced in any direction.

The optical scanner 52 of "Type 3" in the arrangement example table 41 is configured so that only the piezoelectric element 26B is formed on a substrate portion 25B and the center point of the piezoelectric element 26B is disposed in a position out of the axis line 27 and closer to the reflection mirror portion 12. The value approximately 16.5 was obtained as the maximum displacement height H of the outer ends of the reflection mirror portion 12 in the first resonant state, when applying, to the piezoelectric element 26B, a drive voltage obtained by adding a bias voltage of approximately 30 volts to an alternating voltage of amplitude of approximately 30 volts, if the maximum displacement height H of the "Type 1" was set to be approximately 100.

Accordingly, the optical scanner 52 was able to oscillate the reflection mirror portion 12 around the oscillation axis 15 through applying the drive voltage as described above to the piezoelectric element 26B. As the reflection mirror portion 12 was able to be oscillated in the first resonant state, the oscillation axis 15 of the reflection mirror portion 12 was not displaced in any direction.

Also, the optical scanner 53 of "Type 4" in the arrangement example table 41 is configured so that the center point of the piezoelectric element 26A formed on the substrate portion 25A is disposed in a position out (in FIG. 8, in a lower side) of the axis line 27 and closer to the reflection mirror portion 12. Also, the optical scanner 53 is configured so that the center point of the piezoelectric element 26B formed on the substrate portion 25B is disposed in a position out of (in FIG. 8, in a lower side) of the axis line 27 in the same direction with the piezoelectric element 26A, and where the division (L2/L1) equals 0.34. The value approximately 19.9 was obtained as the maximum displacement height H of the outer ends of the reflection mirror portion 12 in the first resonant state, when applying, to the piezoelectric elements 26A and 26B, drive voltages in opposite phases obtained by adding a bias voltage of approximately 30 volts to an alternating voltage of amplitude of approximately 30 volts, if the displacement height H of the "Type 1" was set to be approximately 100.

Accordingly, the optical scanner 53 was able to oscillate the reflection mirror portion 12 around the oscillation axis 15 through applying the drive voltages in opposite phases as described above to the piezoelectric elements 26A and 26B. As the reflection mirror portion 12 was able to be oscillated in the first resonant state, the oscillation axis 15 of the reflection mirror portion 12 was not displaced in any direction.

Also, in the optical scanner 54 of "Type 5" in the arrangement example table 41, each of the piezoelectric elements 26A and 26B is formed on each of the substrate portions 25A and 25B so that each the center point of the piezoelectric elements 26A and 26B is disposed on a line 55 which passes through the center point of the reflection mirror portion 12 on the oscillation axis 15 in the direction of the oscillation axis 15 and obliquely intersects with the oscillation axis 15, and that each center point of the piezoelectric elements 26A and 26B is in a position where the division (L2/L1) equals 0.34 (see FIG. 7). That is, the piezoelectric elements 26A and 26B are respectively formed on the substrate portions 25A and 25B symmetrically with respect to the center point of the reflection mirror portion 12 on the oscillation axis 15 in the direction of the oscillation axis 15. The value approximately 27.4 was obtained as the maximum displacement height H of the outer ends of the reflection mirror portion 12 in the first resonant state, when applying to the piezoelectric elements 26A and 26B drive voltages in opposite phases obtained by adding a bias voltage of approximately 30 volts to an alternating voltage of amplitude of approximately 30 volts, if the maximum displacement height H of the "Type 1" was set to be approximately 100.

Accordingly, the optical scanner 54 was able to oscillate the reflection mirror portion 12 around the oscillation axis 15 through applying the drive voltages in opposite phases as described above to the piezoelectric elements 26A and 26B. The reflection mirror portion 12 was able to be oscillated in the first resonant state, and therefore the oscillation axis 15 of the reflection mirror portion 12 was not displaced in any direction.

As has been described above, in the optical scanner 1 directed to the present embodiment, the side portions of substrate portions 25A and 25B which are located closer to the reflection mirror portion 12 are connected, at the both ends of each side portion, by supporting beam portions 21A and 21B, and the outer side portions of the substrate portions 25A and 25B are fixed to a fixing frame 5. Piezoelectric elements 26A and 26B having upper electrodes 28A and 28B formed thereon are formed, respectively, on the substrate portions 25A and 25B. Furthermore, the substrate portions 25A and 25B, the supporting beam portions 21A and 21B and the piezoelectric elements 26A and 26B are disposed symmetrically in the right angle direction with respect to an oscillation axis 15. Meanwhile, torsion beam portions 22A and 22B extend from the two opposite sides of the reflection mirror portion 12 on the oscillation axis 15 outward on the same plane and connected to the supporting beam portions 21A and 21B, respectively.

Accordingly, applying drive voltages in mutually opposite phases to the piezoelectric elements 26A and 26B makes it possible to produce a standing wave having the node at the oscillation axis 15 in the substrate portions 25A and 25B and the supporting beam portions 21A and 21B. In addition, through the torsion beam portions 22A and 22B, a rotational moment acts on the reflection mirror portion 12 by the standing wave, and oscillates the reflection mirror portion 12 around the oscillation axis 15 which is the axis core of the torsion beam portions 22A and 22B. Thus, as the standing wave has the node at the oscillation axis 15, the reflection mirror portion 12 can be oscillated without any displacement in any direction with respect to the oscillation axis 15 of the reflection mirror portion 12. Also, as the oscillation axis 15 of the reflection mirror portion 12 is not displaced in any direction, the effective efficiency of the reflected light of the reflection mirror portion 12 can be improved.

Also, each of the piezoelectric elements 26A and 26B is formed in a position separated from each outer side portion connected to the fixing frame 5 of the substrate portions 25A and 25B in the direction to the reflection mirror portion 12, enabling secure production of the standing wave having the node at the oscillation axis 15 in the substrate portions 25A and 25B and the supporting beam portions 21A and 21B.

Each of the piezoelectric elements 26A and 26B is formed, across the reflection mirror portion 12, symmetrically with respect to the axis line 27 passing through the center point of the reflection mirror portion 12 on the oscillation axis 15 and intersecting with the oscillation axis 15 at right angles, so that the amplitude can be increased of the standing wave having the node at the oscillation axis 15 produced in the substrate portions 25A and 25B and the supporting beam portions 21A and 21B, and further, that the displacement height H around the oscillation axis 15 of the reflection mirror portion 12 can be securely increased.

Further, through applying drive voltages in mutually opposite phases to piezoelectric elements 26A and 26B and oscillating the reflection mirror portion 12 in the first resonant state in which the reflection mirror portion 12 is oscillated in the same phase with the oscillation of the supporting beam portions 21A and 21B, the displacement height H around the oscillation axis 15 of the outer ends of the reflection mirror portion 12 can securely be increased, compared with a case of oscillating the reflection mirror portion 12 in the second resonant state in which the oscillation is in the opposite phase with the oscillation of supporting beam portions 21A and 21B.

In addition, through forming the main body portion 2 by use of an elastic, electroconductive material such as stainless steel, titanium or iron, the need of the lower electrode formation with respect to the piezoelectric elements 26A and 26B can be eliminated, enabling the simplified structure thereof.

It should be understood that the disclosure is not limited to the particular embodiments disclosed, but it is intended to cover changes and modifications within the spirit and scope of the disclosure as defined by the appended claims. The following modifications, for example, may be possible.

(A) A main body portion 2 may be formed by use of an elastic, non-electroconductive material such as silicon or quartz, with thickness of 30 μm to 100 μm. In this case, a substrate portion in a thin rectangle shape made of silicon and 30 μm to 100 μm thick is to be prepared, on which a resist film is formed to mask the whole area, leaving the areas for through holes 6 and a through hole 10 unmasked. Then the through holes 6 and the through hole 10 are formed by etching, and following that, the resist film is removed. Accordingly, there are formed the fixing frame 5, the reflection mirror portion 12, the torsion beam portions 22A and 22B, the supporting beam portions 21A and 21B, and substrate portions 25A and 25B.

Also in this case, platinum (Pt), gold (Au) or the like is layered approximately 0.2 μm to 0.6 μm thick on the substrate portions 25A and 25B respectively, from the areas for forming piezoelectric elements 26A and 26B to the fixing frame 5, so as to form a pair of lower electrodes 61A and 61B (not shown). After that, piezoelectric elements 26A and 26B are formed on the lower electrodes 61A and 61B, and further, upper electrodes 28A and 28B may be formed on the piezoelectric elements 26A and 26B.

Accordingly, it becomes possible to apply wire-bonding to the lower electrodes 61A and 61B and to the upper electrodes 28A and 28B, and then to energize the piezoelectric elements 26A and 26B formed on the substrate portions 25A and 25B respectively with drive voltages in mutually opposite phases. In addition, it becomes possible to form upper electrodes 28A and 28B, piezoelectric elements 26A and 26B and lower electrodes 61A and 61B by use of the conventional thin-film technology such as a sputtering method or a chemical vapor deposition (CVD) method.

(B) Also, instead of the piezoelectric elements 26A and 26B, there can be employed, for example, a magnetostrictive film made of a highly magnetostrictive material which expands or contracts in accordance with an alternating magnetic field from outside, or a permanent magnet film which is attracted or repulsed in accordance with the alternating magnetic field from outside, by use of the AD method and the like. Then, a pair of coils may be provided each in the proximity of each of the substrate portions 25A and 25B, and the alternating magnetic field may be formed through energizing the pair of coils with alternate currents in mutually opposite phases. Accordingly, the standing wave having the node at the oscillation axis 15 may be produced in the substrate portions 25A and 25B and the supporting beam portions 21A and 21B, enabling the oscillation of the reflection mirror portion 12 around the oscillation axis 15. In this case, it is desirable that the main body portion 2 is formed of a nonmagnetic material.

(C) Also, the formation of the fixing frame 5 may be omitted, for example, and the outer side portions of the substrate portions 25A and 25B may be extended to the supporting portion 18 of the base 3 and be fixed directly on the supporting portion 18. Accordingly, the size reduction of the main body portion 2 can be achieved.

While the presently exemplary embodiments have been shown and described, it is to be understood that this disclosure is for the purpose of illustration and that various changes and modifications may be made without departing from the scope of the disclosure as set forth in the appended claims.

What is claimed is:

1. An optical scanner comprising:
   a mirror portion to be oscillated around an oscillation axis so as to scan light in a predetermined direction;
   a pair of torsion beam portions arranged along the oscillation axis of the mirror portion, each of the pair of torsion beam portions having one end connected to one of two opposing ends of the mirror portion with respect to a direction of the oscillation axis;
   a pair of supporting beam portions extending along a direction at right angles to the oscillation axis, the pair of supporting beam portions arranged at opposite sides across the mirror portion and the pair of torsion beam portions, each center of the pair of supporting beam portions in a longitudinal direction is connected to other end of each of the pair of torsion beam portions, and both ends of each of the pair of supporting beam portions in the longitudinal direction are positioned outside with respect to both ends of the mirror portion in the direction at right angles to the oscillation axis, respectively;
   a pair of substrate portions arranged next to the both ends of the mirror portion in the direction at right angles to the oscillation axis, respectively, and at opposite sides across the mirror portion, symmetrically with respect to the direction at right angles to the oscillation axis, each of the pair of substrate portions being tabular-shaped, wherein, in one of the pair of substrate portions, a side edge portion facing the mirror portion is connected to one end of each of the pair of supporting beam portions with respect to the longitudinal direction, and in other of the pair of substrate portions, a side edge portion facing the mirror portion is connected to other end of each of the pair of supporting beam portions with respect to the longitudinal direction;
   a fixing member to be connected to an outer side portion of each of the pair of substrate portions, the outer side portion with respect to the direction at right angles to the oscillation axis; and
   an excitation device formed on a surface of at least one of the pair of substrate portions,
   wherein an edge on an outer side of the excitation device with respect to the direction at right angles to the oscillation axis is spaced from an outer side portion of the at least one of the pair of substrate portions in a direction closer to the mirror portion, the outer side portion with respect to the direction at right angles to the oscillation axis.

2. The optical scanner according to claim 1, wherein a center point of the excitation device is positioned on a line passing through a center point of the mirror portion on the oscillation axis with respect to the direction of the oscillation axis, the line intersecting with the oscillation axis at right angles.

3. The optical scanner according to claim 1, wherein:
   the excitation device is formed on a surface of each of the pair of substrate portions, and
   the excitation device formed on one substrate portion and the excitation device formed on other substrate portion are driven so as to oscillate in mutually opposite phases respectively.

4. The optical scanner according to claim 3, wherein the excitation devices are formed, on opposite sides across the mirror portion, symmetrically with respect to the center point of the mirror portion on the oscillation axis with respect to the direction of the oscillation axis.

5. The optical scanner according to claim 4, wherein the excitation devices are formed, on opposite sides across the mirror portion, symmetrically with respect to a line passing through the center point of the mirror portion on the oscillation axis with respect to the direction of the oscillation axis and intersecting with the oscillation axis at right angles.

6. The optical scanner according to claim 1, wherein the mirror portion is formed symmetrically with respect to the oscillation axis.

7. The optical scanner according to claim 1, wherein the excitation device is driven so that the mirror portion oscillates in a same phase as oscillation of the pair of supporting beam portions.

8. The optical scanner according to claim 1, wherein the excitation device comprises a piezoelectric element.

9. The optical scanner according to claim 8, wherein:
   the pair of substrate portions is formed of an electroconductive material, and
   the excitation device comprising the piezoelectric element further comprises an upper electrode layered on the piezoelectric element.

10. The optical scanner according to claim 8, wherein:
    the pair of substrate portions is formed of a non-electroconductive material, and
    the excitation device comprising the piezoelectric element further comprises:
        a lower electrode layered on a surface of a substrate portion, the lower electrode on which the piezoelectric element is layered; and
        an upper electrode layered on the piezoelectric element.

11. The optical scanner according to claim 1, wherein a value obtained by dividing a distance from the outer side portion of the substrate portion with respect to the direction at right angles to the oscillation axis to the center point of the excitation device by a length of the substrate portion with respect to the direction at right angles to the oscillation axis is set to be within a range of 0.32 to 0.36.

* * * * *